United States Patent

Koga et al.

[11] Patent Number: 4,600,897
[45] Date of Patent: Jul. 15, 1986

[54] VOLTAGE-CONTROLLED OSCILLATOR OF EMITTER-COUPLED ASTABLE MULTIVIBRATOR TYPE

[75] Inventors: Takashi Koga, Fukaya; Hisakazu Hitomi, Yokohama, both of Japan

[73] Assignee: Kabushiki Kaisha Toshiba, Kawasaki, Japan

[21] Appl. No.: 661,970

[22] Filed: Oct. 17, 1984

[51] Int. Cl.[4] .............................. H03K 3/281
[52] U.S. Cl. .................. 331/113 R; 331/144; 332/14
[58] Field of Search ........... 331/113 R, 108 C, 108 R, 331/108 D, 144; 332/14, 16 T

[56] References Cited

U.S. PATENT DOCUMENTS

| 3,588,746 | 6/1971 | Luna et al. | 331/113 R X |
| 4,007,426 | 2/1977 | Utsunomiya | 331/113 R X |
| 4,025,877 | 5/1977 | Hara et al. | 331/144 X |
| 4,435,734 | 3/1984 | Hedberg et al. | 332/14 X |

FOREIGN PATENT DOCUMENTS 2252774 8/1979 Fed. Rep. of Germany .

OTHER PUBLICATIONS

Patents Abstracts of Japan, E-7, Apr. 18, 1980, vol. 4, No. 52.
Patents Abstracts of Japan, E-52, Apr. 16, 1981, vol. 5, No. 55.

Primary Examiner—Eugene R. LaRoche
Assistant Examiner—Robert J. Pascal
Attorney, Agent, or Firm—Cushman, Darby & Cushman

[57] ABSTRACT

A resistor, together with a charging capacitor, is connected in series between the emitters of transistors to constitute an emitter-coupled astable multivibrator to be used with a voltage-controlled oscillator. The resistance of the resistor is given by:

$$R_a = (\tau_{d1} + \tau_{d2})/2C_a$$

where $C_a$ is capacitance of the capacitor and $(\tau_{d1} + \tau_{d2})$ is a delay time during one period of oscillation, as determined by the circuit elements.

5 Claims, 8 Drawing Figures

VOLTAGE-CONTROLLED OSCILLATOR OF EMITTER-COUPLED ASTABLE MULTIVIBRATOR TYPE

BACKGROUND OF THE INVENTION

The present invention relates to a voltage-controlled oscillator using an emitter-coupled astable multivibrator.

The voltage-controlled oscillator is frequently used in electronic devices requiring voltage to frequency conversion, such as FM modulators, PLL circuits, and voltage/frequency converters.

A conventional voltage-controlled oscillator using an emitter-coupled astable multivibrator will be described referring to FIG. 1, in terms of problems of the prior art.

In FIG. 1, transistors Q1 to Q7, resistors R1 and R2, a voltage source V1, current sources I1 and I2, and a capacitor C cooperate to form an emitter-coupled astable multivibrator. Transistors Q8 and Q9, and resistors R3 and R4 form a circuit for converting a control voltage $V_I$ of the voltage source V2 into a current. This circuit provides the operating current for the multivibrator.

FIG. 2 shows a set of waveforms of the signals at points A to D of the FIG. 1 circuit when it is operating. In the waveform diagram, the on state of the transistors Q1, Q3, Q6 and Q7 is illustrated at a high level, while the off state is shown at a low level. During a period T1, the transistors Q3 and Q7 are turned on, while the transistors Q1 and Q6 are turned off by a positive feedback circuit function. The current path of the capacitor C is routed through a path of the emitter of transistor Q7→capacitor C→collector of transistor Q8. The current determined by the collector current of the transistor Q8 flows into the capacitor C. Under this condition, the transistor Q7 is on, and therefore the emitter potential thereof is fixed. Therefore, as the capacitor C charges, the emitter potential of the transistor Q6 decreases, and then the transistor Q6 is turned on. Immediately after the transistor Q6 is turned on, the transistor Q1 is also turned on, and the transistor Q3, and Q7 are turned off by the positive feedback function. This operating state of the circuit is illustrated during a period T2 in FIG. 2. The periods T1 and T2 are alternately repeated, so that the oscillation is continued.

Let us examine the ideal oscillating frequency $F_I$ of the circuit under discussion. The base potentials $V_{B6(2)}$ and $V_{B7(2)}$ of the transistors Q6 and Q7 during the period T2 are given as:

$$V_{B6(2)} = V_{CC} - V_{BE2} - V_{BE5} \quad (1)$$

$$V_{B7(2)} = V_{CC} - V_{ref} - V_{BE1} - V_{BE4} \quad (2)$$

where $V_{CC}$: Voltage of power source +B
$V_{ref}$: Voltage of voltage source V1
$V_{BEn}$: forward voltage drop across the base and the emitter of the transistor Qn (n=1 to 9) (this is true for the equations as given below)

At this time, the transistor Q6 is turned on, and from the equation (1), we have the emitter potential $V_{B6(2)}$ of the transistor Q6 given by:

$$V_{E6(2)} = V_{CC} - V_{BE2} - V_{BE5} - V_{BE6} \quad (3)$$

As seen from equation (3), the emitter potential $V_{E7(2)}$ of the transistor Q6 is fixed. On the other hand, since the transistor Q7 is off, the emitter potential $V_{E7(2)E}$ of the transistor Q7 decreases with the charging of the capacitor C. When the emitter potential $E_{E7(2)}$ of the transistor Q7 at the end of the period T2 drops by the forward voltage drop across the base and the emitter below the base potential $V_{B7(2)}$ of the transistor Q7 as given by equation (2), that is to say, as the following equation holds:

$$V_{E7(2)E} = V_{CC} - V_{ref} - V_{BE1} - V_{BE4} - V_{BE7} \quad (4)$$

the circuit state is inverted and returns to the period T1 state. At this time, the emitter potential $V_{E7(1)}$ of the transistor Q7 instantaneously changes to:

$$V_{E7(1)} = V_{CC} - V_{BE2} - V_{BE4} - V_{BE7} \quad (5)$$

because the transistor Q7 is switched from off to on. Thus, the emitter potential of the transistor Q7 instantaneously changes from $V_{E7(2)E}$ to $V_{E7(1)}$. A potential difference between the emitter potentials $V_{E7(2)E}$ and $V_{E7(1)}$ is expressed by subtracting equation (4) from (5), we have:

$$V_{E7(1)} - V_{E7(2)E} = V_{ref} \quad (6)$$

It should be noted that the present discussion is based on the assumption that the forward voltage drops $V_{BEn}$ across the base and the emitter of all of the transistors are equal to one another. The potential $V_{ref}$ is transmitted, intact to the emitter of the transistor Q6 coupled with one end of the capacitor C. The emitter potential $V_{E6(1)S}$ of the transistor Q6 at the initial stage of the period T1 is:

$$V_{E6(1)S} = V_{CC} - V_{BE2} - V_{EB5} - V_{BE6} + V_{ref} \quad (7)$$

The above equation is led from equation (3). From this state, charging the capacitor C starts in the direction opposite that in the case of period T2. Then, the emitter potential of the transitor Q6 gradually drops and reaches the following potential:

$$V_{E6(1)E} = V_{CC} - V_{ref} - V_{BE3} - V_{EB5} - V_{BE6} \quad (8)$$

At this time, the circuit state instantaneously changes from the period T1 state to the period T2 state.

During the period T1, The transistor Q7 is on and its emitter potential $V_{E7(1)}$ is fixed as given below:

$$V_{E7(1)} = V_{CC} - V_{BE2} - V_{BE4} - V_{BE7} \quad (9)$$

A change in the potential $\Delta V_C$ across the capacitor C during one period is obtained by subtracting equation (8) from equation (7) and is:

$$\Delta V_C = V_{E6(1)S} - V_{E6(1)E} = 2V_{ref} \quad (10)$$

In this case, it is assumed that the forward voltage drops $V_{BEn}$ across the base and the emitter of all of the transistors are equal to each other.

During period T1, the current flowing into the capacitor C depends on the collector current of the transistors Q8. During period T2, it depends on the collector current of the transistor Q9. If the transistors Q8 and Q9 have the same characteristics, and the resistors R3 and R4 have equal resistances, the collector currents of the transistors Q8 and Q9 are equal to each other. The value of this current $i_C$ is controlled by the control voltage $V_I$, as seen from FIG. 1. The duration t of the periods T1 and T2 is:

$$t = \frac{\Delta V_C \cdot C_a}{i_C} = \frac{2V_{ref} \cdot C_a}{i_C} \tag{11}$$

where $C_a$:
Capacitance of the capacitor C.
An ideal oscillating frequency $F_i$ with a period 2t is:

$$F_i = \frac{1}{2t} = \frac{i_C}{4V_{ref} \cdot C_a} \tag{12}$$

Equation (12) teaches that the oscillating frequency $F_i$ can be linearly changed through control of the current $i_C$ by the control voltage $V_I$.

In an actual circuit, an operation delay is inevitable due to the parasitic capacitance associated with the circuit elements, and the stray capacitance associated with the circuit wiring. This delay occurs when inverting the operation mode of the circuit, i.e. at the boundary between the periods T1 and T2. As seen from FIG. 3, there are observed delays $\tau_{d1}$ and $\tau_{d2}$ at the rise and fall times of the waveforms A to D and the potential difference $\Delta V_C$. Using these delays $\tau_{d1}$ and $\tau_{d2}$, the actual oscillating frequency $F_r$ is:

$$F_r = \frac{1}{2t + \tau_{d1} + \tau_{d2}} = \frac{1}{\frac{4V_{ref} \cdot C_a}{i_C} + \tau_{d1} + \tau_{d2}} \tag{13}$$

As seen from equation (13), the actual frequency $F_r$ can also be controlled by the current $i_C$, but the linearity of the frequency $F_r$ against the current $i_C$ deteriorates because of the presence of the term $(\tau_{d1} + \tau_{d2})$. Since the term $(\tau_{d1} + \tau_{d2})$ is fixed, the linearity deterioration is more marked as the frequency $F_r$ is controlled to be large (duration t is made small). The relationship between the oscillating frequency vs. the controlled voltage $V_I$ in the circuit is as shown in FIG. 4. The graph shows that nonlinearity becomes more distinctive as the oscillating frequency increases.

SUMMARY OF THE INVENTION

Accordingly, an object of the present invention is to provide a voltage-controlled oscillator with an improved oscillating frequency vs. control voltage performance.

According to the present invention, there is provided a voltage-controlled oscillator of the emitter-coupled astable multivibrator type comprising: a first transistor; a second transistor; a series circuit connected between the emitters of the first and second transistors and including at least a capacitor and an impedance element which exhibits an imaginary part for an operating frequency range of the voltage-controlled oscillator being negligible with respect to a real part; first and second loads connected respectively to the collectors of the first and second transistors; feedback means connected between the collector of the first transistor and the base of the second transistor, and connected between the collector of the second transistor and the base of the first transistor; first and second current sources respectively connected to the emitters of the first and second transistors; and a control voltage source commonly connected to said first and second current sources.

DETAILED DESCRIPTION OF THE PREFERRED EMBODIMENTS

Figure 1:
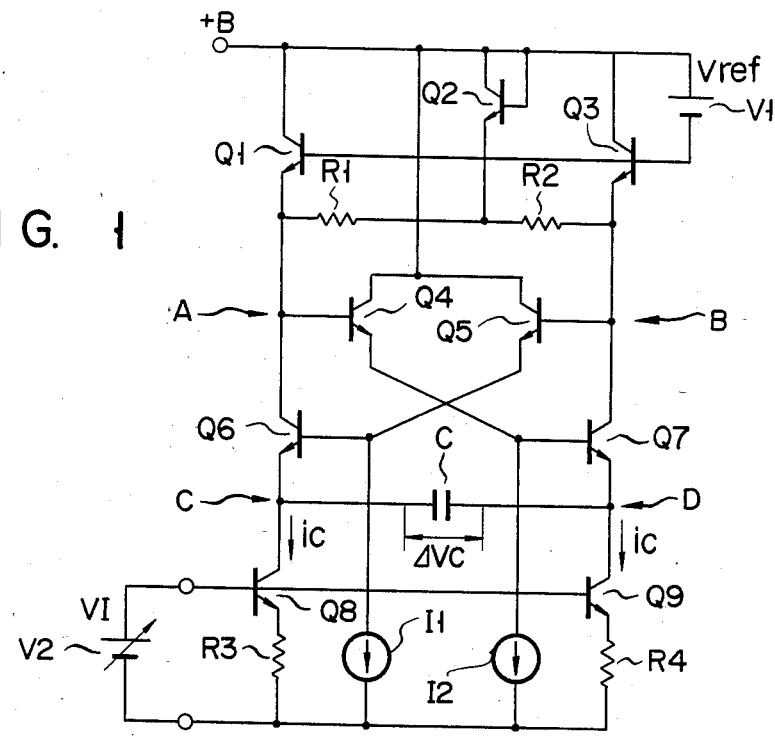
FIG. 1 shows a circuit diagram of a conventional voltage-controlled oscillator using an emitter-coupled astable multivibrator.
Figure 2:
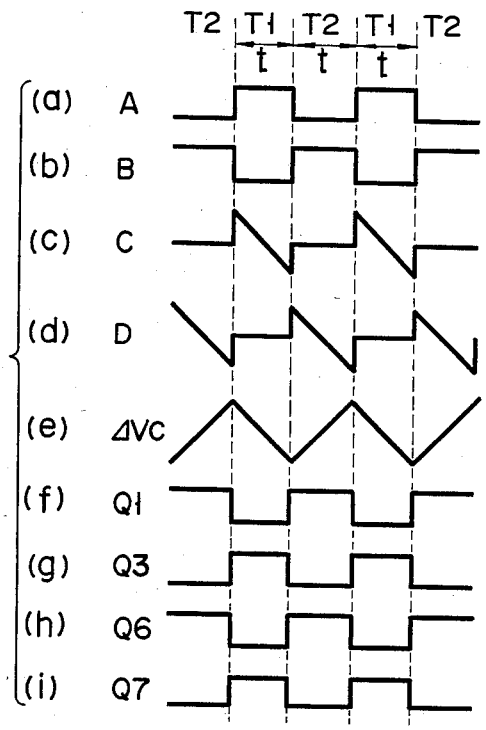
FIG. 2 shows a set of ideal waveforms at the respective portions in the FIG. 1 circuit.
Figure 3:
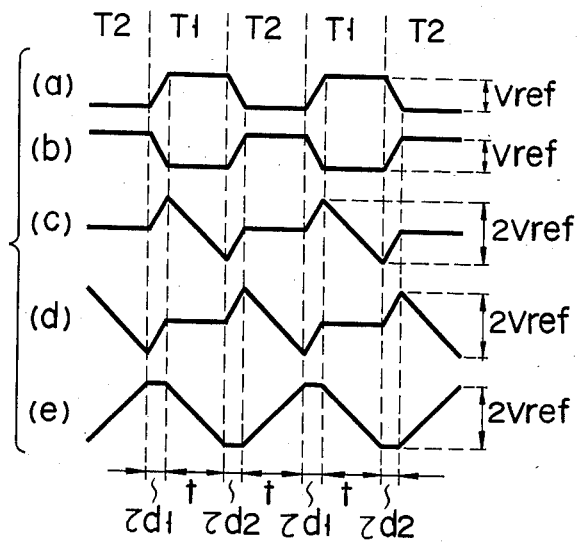
FIG. 3 shows a set of actual waveforms at the respective portions in the FIG. 1 circuit.
Figure 4:
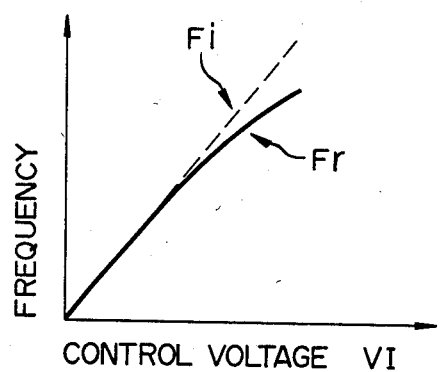
FIG. 4 graphically shows a relationship of oscillating frequency vs. control voltage in the FIG. 1 circuit.
Figure 5:
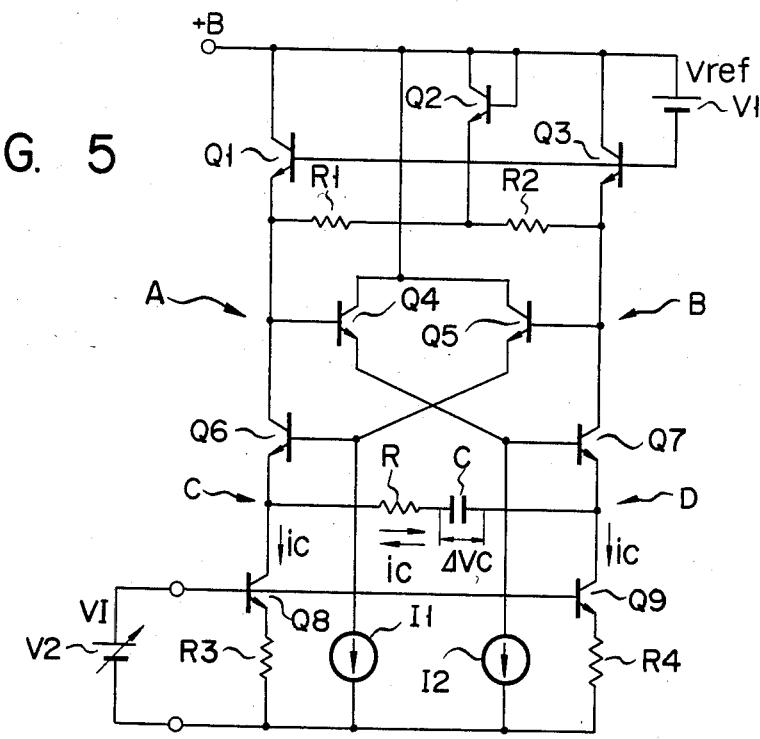
FIG. 5 shows a circuit diagram of an embodiment of a voltage-controlled oscillator according to the present invention.

Reference is made to FIG. 5 illustrating a voltage-controlled oscillator of a first embodiment according to the present invention. The only difference between the FIG. 5 circuit and the FIG. 1 circuit resides in that a resistor R is serially connected to the capacitor C in FIG. 5. As shown, a series circuit of the resistor R and the capacitor C is inserted between the emitters of the transistors Q6 and Q7. The remaining circuit arrangement is the same as that of the FIG. 1 circuit, and therefore no further explanation thereof will be given.

In operation, a charge current $i_C$ to the capacitor C flows through the resistor R. Then the potential difference $\Delta V_R$ across the capacitor C is given by:

$$\Delta V_R = i_C \cdot R_a \tag{15}$$

where $R_a$: resistance across the resistor R. When the resistor R is not present, the potential $\Delta V_C$ across the capacitor C is $2V_{ref}$ as given by equation (10), and the potential difference across the capacitor C in the FIG. 5 circuit is:

$$\Delta V_{C(R)} = 2V_{ref} - i_C \cdot R_a$$

Accordingly, considering the delay times $\tau_{d1}$ and $\tau_{d2}$ of the circuit elements, the oscillating frequency $F_{r(R)}$ is given by:

$$F_{r(R)} = \frac{1}{\frac{2(2V_{ref} - i_C \cdot R_a) \cdot C_a}{i_C} + \tau_{d1} + \tau_{d2}} \tag{16}$$

$$= \frac{i_C}{4V_{ref} \cdot C_a + i_C \cdot (\tau_{d1} + \tau_{d2} - 2R_a \cdot C_a)}$$

In the above equation, if the reistance $R_a$ of the resistor R is selected so as to satisfy:

$$R_a = (\tau_{d1} + \tau_{d2})/2C_a \tag{17}$$

equation (16) can be rewritten as:

$$F_{r(R)} = i_C/(4V_{ref}C_a) \tag{18}$$

This equation is the same as that of the ideal case represented by equation (12). Therefore, the oscillating frequency $F_{r(R)}$ can linearly be controlled by the current $i_C$.

Figure 6:
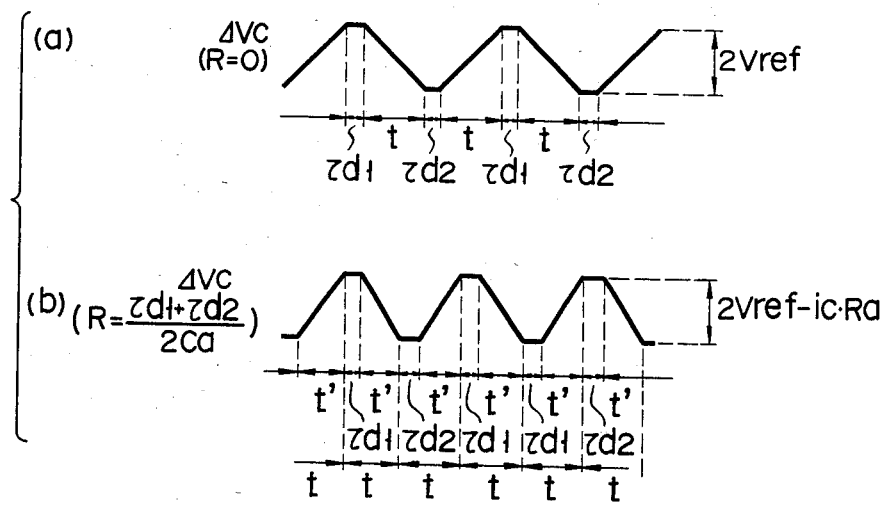
FIG. 6 comparatively shows a set of signal waveforms across the emitter coupling capacitors in the FIG. 1 and FIG. 2 circuits.

The waveform of the voltage across the capacitor C is as illustrated in FIG. 6. The waveform (a) in FIG. 6 is plotted when $R_a=0$, viz. for the conventional case. The waveform (b) in FIG. 6 is plotted when $R_a=(\tau_{d1}+\tau_{d2})/2C_a$, viz. for the present embodiment. As seen from the waveform (b), the period is 2t for any current $i_C$, and is the same as that of the ideal waveform. In FIG. 6, time t' is:

$$t'=t-(\tau_{d1}+\tau_{d2})/2 \qquad (19)$$

Figure 7:
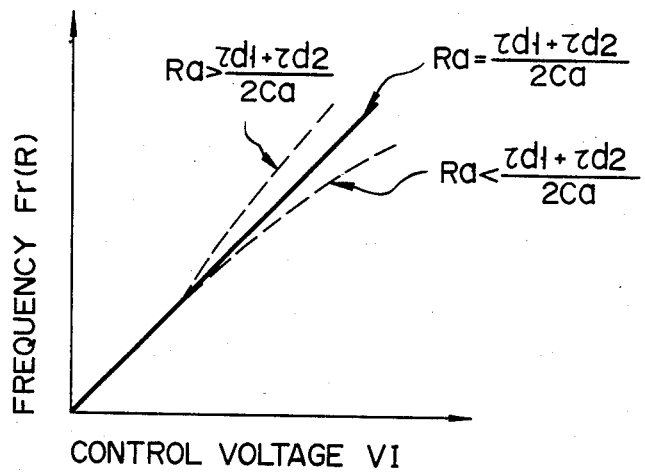
FIG. 7 shows the relationship of the oscillating frequency vs. control voltage in the FIG. 5 circuit.

FIG. 7 shows a relationship of the frequency $F_r$ vs. the control voltage $V_I$, with a parameter of resistance $R_a$. The graph shows that the characteristic is linear when $R_1=(\tau_{d1}+\tau_{d2})/2C$, and nonlinear for other cases.

The resistor R may be substituted by any other element if it operates as a resistive element for the frequency $F_r$. For example, an impedance element or an IC circuit may be used if it exhibits an imaginary part for the frequency $F_r$ being negligible with respect to a real part.

Figure 8:
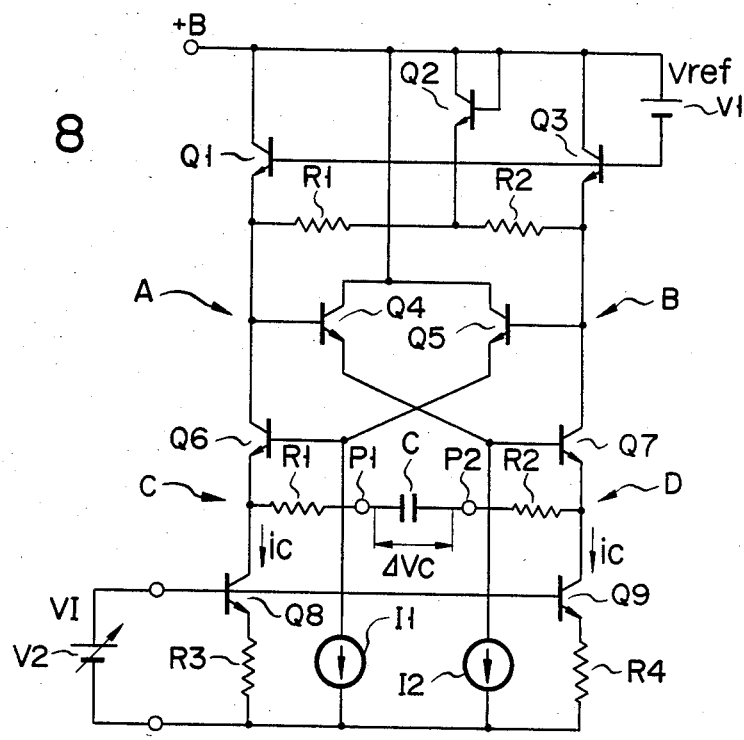
FIG. 8 shows a circuit diagram of a voltage-controlled oscillator, which is another embodiment of the present invention.

FIG. 8 shows a voltage-controlled oscillator which is a second embodiment of the present invention.

In this example, the resistor R is placed by two resistors R1 and R2 connected in series to both ends of the capacitor C. It is evident that the embodiment thus arranged can attain effects similar to that of the first embodiment.

When the votage-controlled oscillator is fabricated into an IC, and the capacitor C is externally connected to the IC chip, terminals P1 and P2 for the external connection of the capacitor C are additionally required. In this case, however, the resistors R1 and R2 can be used as protecting resistors for preventing excessive currents for the transistors Q6 and Q7 respectively connected to the pins P1 and P2. To maximize this effect for the two transistors Q6 and Q7, it is suggested to select the resistance of the resistors R1 and R2 as $R_a/2$. In manufacturing electronic devices using the voltage-controlled oscillator, the external pins P1 and P2 may mistakenly be connected to the power terminals. In such a case, the connected resistors R1, R2 protect the transistors Q6 and Q7 from an excessive current.

As seen from the foregoing, according to the present invention, a voltage-controlled oscillator exhibits a good linearity in the oscillating frequency vs. control voltage relation, and is adaptable for IC fabrication. Such a voltage-controlled oscillator is realized by merely connecting at least one resistive element in series to the emitter coupling capacitor.

What is claimed is:

1. A voltage-controlled oscillator of the emitter-coupled astable multivibrator type comprising:
   a first transistor;
   a second transistor;
   a series circuit connected between the emitters of the first and second transistors and including at least a capacitor and an impedance element which exhibits an imaginary part for an operating frequency range of said voltage-controlled oscillator being negligible with respect to a real part, the real part consisting of a resistive value Ra which is so selected as to satisfy $$Ra=(\tau d1+\tau d2)/2Ca$$

where Ca is the capacitance of said capacitor and $(\tau d1+\tau d2)$ is a delay time during one oscillation period of the voltage controlled oscillator;
   first and second loads connected respectively to the collectors of said first and second transistors;
   feedback means connected between the collector of said first transistor and the base of said second transistor, and connected between the collector of said second transistor and the base of said first transistor;
   first and second current sources respectively connected to the emitters of said first and second transistors; and
   a control voltage source commonly connected to said first and second current sources.

2. The voltage-controlled oscillator according to claim 1, in which said impedance elements is a single resistor.

3. The voltage-controlled oscillator according to claim 2, in which the resistance of said resistor is substantially equal to a value obtained when the sum of delay times caused by circuit elements during one period of the output signal of said voltage-controlled oscillator is divided by twice the capacitance of said capacitor.

4. The voltage-controlled oscillator according to claim 1, in which said impedance element is a couple of resistors having substantially equal resistances.

5. The voltage-controlled oscillator according to claim 4, in which said two resistors are respectively connected at one end to the emitters of said first and second transistors and at the other end to a pair of external pins, and said capacitor is connected between the pair of said pins.

* * * * *